(12) United States Patent
Chang

(10) Patent No.: US 7,057,894 B2
(45) Date of Patent: Jun. 6, 2006

(54) COMPUTER SYSTEM WITH A LIQUID-COOLING THERMAL MODULE HAVING A PLURALITY OF PUMPS

(75) Inventor: Hung Chang, Taipei (TW)

(73) Assignee: Micro-Star Int'l Co., Ltd., Jung-He (TW)

( * ) Notice: Subject to any disclaimer, the term of this patent is extended or adjusted under 35 U.S.C. 154(b) by 274 days.

(21) Appl. No.: 10/605,851

(22) Filed: Oct. 30, 2003

(65) Prior Publication Data

US 2004/0233632 A1  Nov. 25, 2004

(30) Foreign Application Priority Data

May 20, 2003  (TW) .............................. 92113655 A

(51) Int. Cl.
  *H05K 7/20*  (2006.01)
(52) U.S. Cl. .................... 361/699; 361/687; 165/80.4; 174/15.2; 174/16.1; 257/713; 257/714
(58) Field of Classification Search ................ 361/687, 361/699; 257/714
See application file for complete search history.

(56) References Cited

U.S. PATENT DOCUMENTS

| 4,897,762 | A  | * | 1/1990 | Daikoku et al. ............. 361/689 |
| 6,546,360 | B1 | * | 4/2003 | Gilbert et al. ............... 702/188 |
| 6,840,304 | B1 | * | 1/2005 | Kobayashi et al. ......... 165/11.1 |
| 2004/0008483 | A1 | * | 1/2004 | Cheon ......................... 361/687 |

* cited by examiner

*Primary Examiner*—Lynn Feild
*Assistant Examiner*—Zachary M. Pape
(74) *Attorney, Agent, or Firm*—Winston Hsu

(57) ABSTRACT

A computer system includes a processor for processing data, a storage unit for storing data, and a liquid cooling thermal module for dissipating heat generated by the processor. The thermal module has a liquid coolant carrying pipe adjacent to the processor for conducting heat, and a cooling device. The cooling device has a plurality of tanks, which are connected with each other.

7 Claims, 2 Drawing Sheets

COMPUTER SYSTEM WITH A LIQUID-COOLING THERMAL MODULE HAVING A PLURALITY OF PUMPS

BACKGROUND OF INVENTION

1. Field of the Invention

The present invention relates to a computer system, and more specifically, to a computer system with a liquid-cooling thermal module having a plurality of pumps.

2. Description of the Prior Art

With the rapid advance of technology, the development speed for electronics such as computers and servers continues to accelerate, especially for the processors thereof. Processors generate more heat when used at higher operational frequencies. For a processor to function at high frequency but in limited volume, heat radiation has become a design bottleneck desperate for a solution.

Although there are many different ways to radiate excess heat, the conventional technology is no longer sufficient to handle the massive amount of heat generated by processors and other components. Therefore, many variations of heat dissipation technology have tried to solve this problem. However, no matter how much the efficiency of the fans of the widely employed air-cooling system is improved, there are still some limitations in solving the heat-generation problem. This is especially true for devices like servers for which computing capability is more rigorously demanded. Traditional fans using air-cooling systems require abundant space for heat dissipation. Such a configuration usually requires an additional power supply for it to work. The noise made by the fans also tends to be annoying in closed workplaces. Additionally, fans generate airflow in computer systems. Because the fans are used to expel the generated heat out of the computers, dust or contaminants may go into the computers with the air intake, which contaminates the electronics, causes damage, accumulates inside, and therefore blocks the air-flow and lowers the efficiency of the cooling. Additionally, expensive industry-used computers are unavoidably exposed to environments harder to cool down and cause pollutions of different types. Hence, the life cycle of these computers is shortened. Therefore, for computer systems required to operate at high frequencies in difficult environments, liquid-cooling systems become a kind of important dissipation module.

Please refer to FIG. 1 showing a block diagram of a liquid-cooling module 12 used in a computer system 10 according to the prior art. The computer system 10 comprises a processor 14, a storage unit 16, and a liquid-cooling module 12. When the computer system 10 is running, internal circuits generate heat, of which the heat generated by the processor 14 is especially influential. Because the internal circuits would be damaged by the heat, the liquid-cooling module 12 is used to rapidly expel the heat. The liquid-cooling module 12 contains a pipe 22, a pump 24, and a tank 26 which contains liquid coolant. The liquid coolant is driven by the pump 24 and continuously cycles from the tank 26 to the pipe 24 (in the direction of arrow A). When flowing through the processor 14, the coolant absorbs and rapidly carries away the heat generated by the processor 14 with its high specific heat to expel the heat from the processor 14.

However, if the pump 24 malfunctions, the coolant will not be able to smoothly cycle through the tank 26 and the pipe 22, and therefore cannot expel the heat from the processor 14. In this situation, the failing of the liquid-cooling module 12 leads to the ruin of the processor 14 and lastly to the break down of the whole computer system 10. Modem operational frequencies of the processor 14 are very high, and the generated heat is quite substantial. Once the liquid-cooling module 12 fails to function, the processor 14 could burn out in just seconds, and the user would not have enough time to respond. How to enhance the structure of the existing liquid-cooling modules to avoid the above situation is a very important topic.

SUMMARY OF INVENTION

It is therefore a primary object of the present invention to provide a computer having a liquid-cooling thermal module, which includes a plurality of pumps to solve the above-mentioned problem.

According to the claimed invention, a computer system includes a processor for processing data, a storage unit for storing data, and a thermal module for dissipating heat generated by the processor. The thermal module comprises a pipe adjacent to the processor for conducting heat and a cooling device. The cooling device comprises a plurality of tanks that are connected with each other. The first tank and the last tank of the plurality of tanks are connected with the pipe, forming a closed loop. When any of pumps is suspended, a control unit controls the other pumps to run faster to sustain the flowing speed of the coolant in the pipe.

It is an advantage of the claimed invention that the thermal module contains a plurality of pumps, so that the thermal module is capable of adjusting the running speed of the plurality of pumps to control the flow speed of the coolant based on the operational status of the processor. When one of the pumps is out of order, the other pumps keep working with a faster speed, so that the thermal module can expel heat normally.

These and other objectives of the claimed invention will no doubt become obvious to those of ordinary skill in the art after reading the following detailed description of the preferred embodiment, which is illustrated in the various figures and drawings.

DETAILED DESCRIPTION

Figure 1:
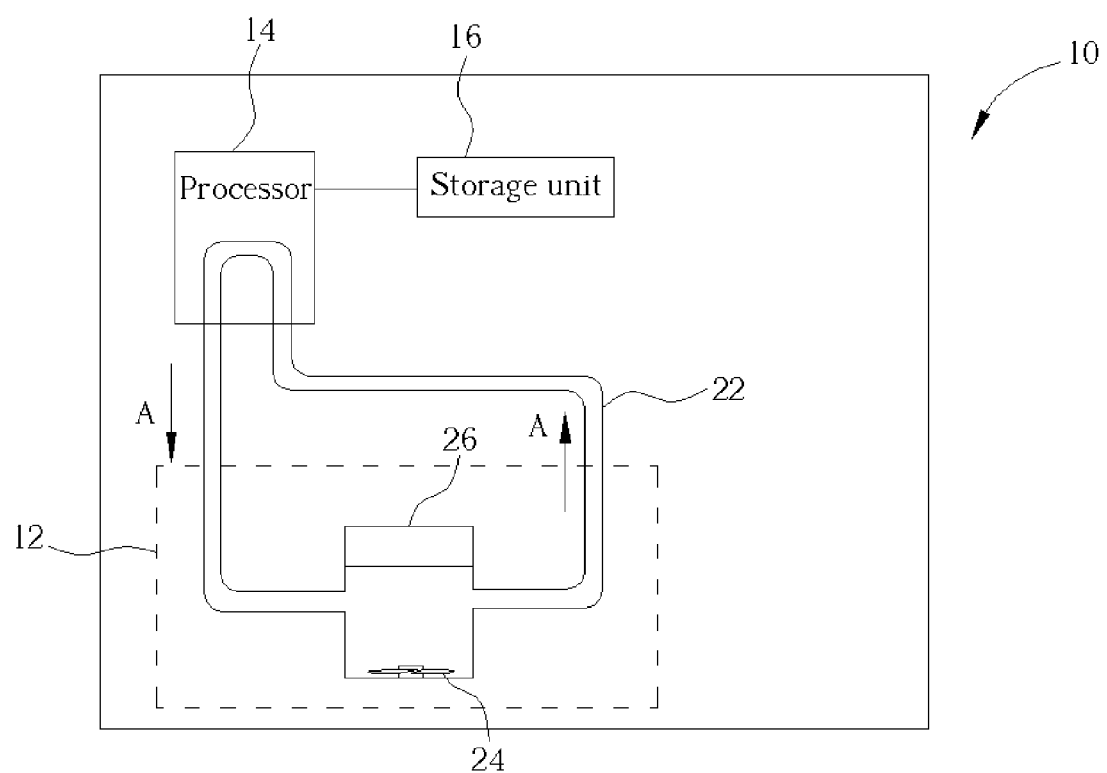
FIG. 1 is a block diagram of a liquid-cooling module used in a computer system according to the prior art.
Figure 2:
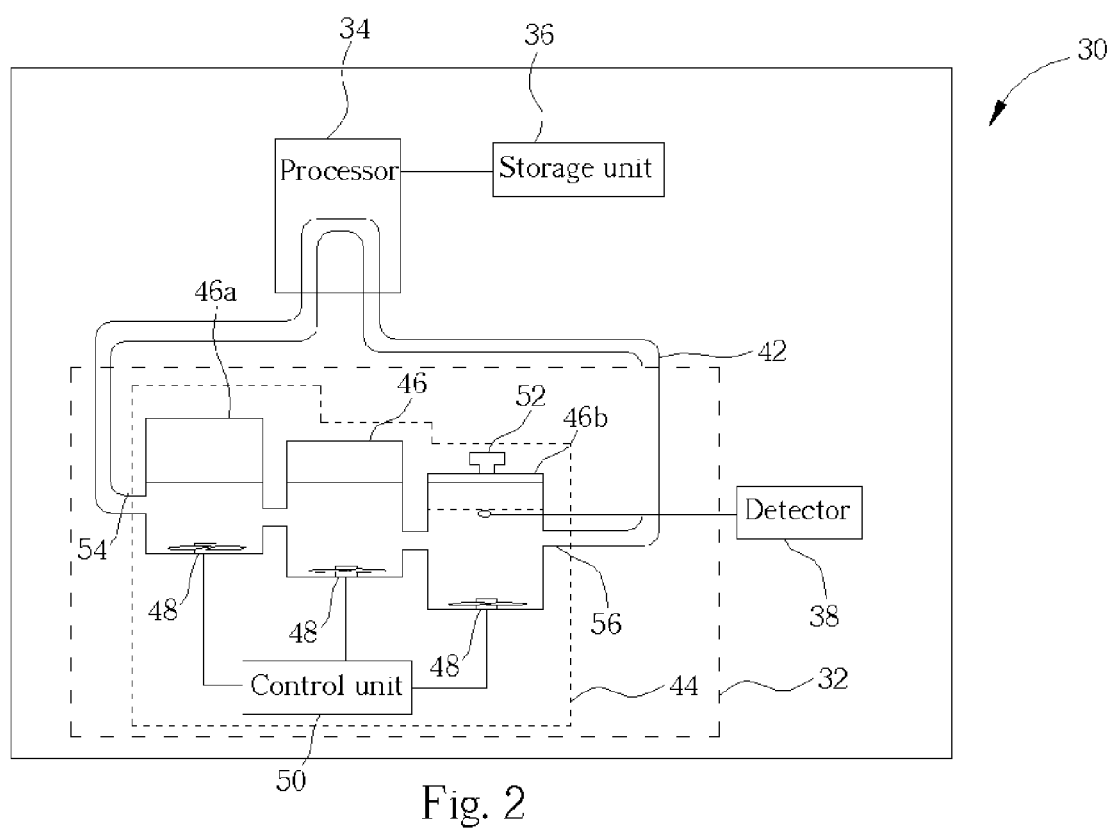
FIG. 2 is a block diagram of a computer system according to the present invention.

Please refer to FIG. 2, which shows a block diagram of a computer system 30 according to the present invention. The computer system 30 comprises a processor 34 for processing data, a storage unit 36 for storing data, a cooling module 32 for expelling heat generated by the processor 34, and a detector 38. The cooling module 32 contains a pipe 42, a part of which is adjacent to the processor 34, for transferring heat, and a cooling device 44. The cooling device 44 comprises a plurality of tanks 46 connected serially, a plurality of pumps 48, a control unit 50, an aperture 52, a liquid-in port 54 and a liquid-out port 56. A first tank 46a (i.e. the tank with the liquid-in port 54) and a last tank 46b (i.e. the tank with the liquid-out port 56) are connected with the pipe 42 to form a closed loop. At least one pump is capable of being coupled to the plurality of tanks 46. Furthermore, the bottom of the last tank 46b is lower than that of other tanks 46. In this way, compared to the design in which the bottoms of the plurality of tanks are at the same horizontal level, the embodiment illustrated in FIG. 2 has a reduced amount of liquid coolant. The detector 38 is coupled to the last tank 46b for detecting the level of the coolant in the last tank 46b and generating an alert signal if the level of the coolant in the last tank 46b is below a predetermined level. In addition to the last tank 46b, the detector 38 can be also coupled to the other tanks 46. It should be noticed that the predetermined level should be higher than the position of the liquid-out port 56 of the last tank 46b. If a lack of liquid coolant is indicated by receiving the alert signal, the coolant can be replenished through the aperture 52. The control unit 50 can be a logic circuit or program code stored in the storage unit 36.

When the computer system 30 starts, the control unit 50 enables the plurality of pumps 48 to run. Meanwhile, the coolant driven by the plurality of pumps 48 flows from the liquid-out port 56 into the pipe 42. When passing through the processor 34, the coolant absorbs the heat generated by the processor 34 and flows toward the liquid-in port 54 of the first tank 46a, which forms a exchanging loop. If the processor 34 generates more heat (for instance, the operating frequency of the processor 34 is increased), the control unit 50 raises the average running speed of the plurality of pumps 48 to accelerate the flow speed of the coolant within the pipe 42 to take away more heat generated by the processor 34, which promotes heat dissipation efficiency. For example, when a lot of data is required to be processed, the processor 34 will raise the operating frequency to increase the speed of the data processing. The higher the operating frequency is, the more heat is generated. Therefore, when detecting an increase in temperature (due to an increase of the operating frequency of the processor 34), the control unit 50 drives the plurality of pumps 48 to run faster so as to promptly carry away the additional heat generated by the processor 34. Similarly, when detecting a temperature reduction (due to a decrease in the operating frequency of the processor 34), the control unit 50 drives the plurality of pumps 48 to run slower, preventing extra power consumption. If one of the pumps 48 is detected that it have stopped operating, the control unit 50 accelerates the speed of the other pumps 48 to keep the same heat dissipation rate. For instance, if one of the plurality of pumps 48 shown in FIG. 2 is suspended, the speed of the other two pumps will be raised by 1.5 times to maintain the flowing speed of the coolant. Consequently, the computer system 30 can continue to work normally with the control mechanism of the thermal module 32.

Moreover, if the detector 38 detects that the level of the coolant is below a predetermined level, it means that the coolant is going to be insufficient, which will probably cause the normal operation of the thermal module 32 to be disrupted. In this situation, the detector 38 generates an alert signal used for informing the user to replenish the coolant. If the coolant is not replenished, the computer system 30 can be terminated after a predetermined time, preventing the processor 34 from damage due to the lack of the coolant forcing the thermal module 32 to suspend operations.

In contrast to prior art, the present invention computer system comprises a thermal module having a plurality of pumps. If one of the pumps fails to operate, the operating speed of the other normal pumps will be appropriately increased so as to maintain the heat dissipation efficiency of the thermal module. In addition, the operating speed of the plurality of pumps can be adjusted depending on the temperature changes due to variations in the operating frequency of the processor, resulting in optimal heat dissipation efficiency.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A computer system comprising: a processor for processing data; a storage unit for storing data; and a thermal module for dissipating heat generated by the processor, the thermal module comprising a pipe, adjacent to the processor for conducting the heat; and a cooling device comprising a plurality of tanks connected serially, wherein a first tank and a last one of the tanks are connected with the pipe to form a closed loop; a plurality of pumps, coupled to the tanks, for driving liquid coolant to flow in the pipe; and a control unit for controlling the rotating speed of said pumps to change the flowing speed of the liquid coolant; wherein the bottom of the last one of the tanks is below the bottoms of the other one of the tanks.

2. The computer system of claim 1, wherein at least one of said pumps is coupled to each tank.

3. The computer system of claim 1, further comprising a detector, coupled to the last one of the tanks, for generating an alert signal when the level in the last one of the tanks is below a predetermined level.

4. The computer system of claim 3, wherein the predetermined level is above the position of a liquid-out port of the last one of the tanks.

5. The computer system of claim 1, wherein said cooling device further comprises an aperture for filling the liquid coolant.

6. The computer system of claim 1, wherein said control unit comprises a program stored in said storage unit.

7. The computer system of claim 1, wherein said control unit comprises a logic circuit.

* * * * *